United States Patent
Jacob et al.

(10) Patent No.: US 9,343,300 B1
(45) Date of Patent: May 17, 2016

(54) METHODS OF FORMING SOURCE/DRAIN REGIONS FOR A PMOS TRANSISTOR DEVICE WITH A GERMANIUM-CONTAINING CHANNEL REGION

(71) Applicant: GLOBALFOUNDRIES Inc., Grand Cayman (KY)

(72) Inventors: Ajey Poovannummoottil Jacob, Watervliet, NY (US); Michael Hargrove, Clinton Corners, NY (US); Jody A. Fronheiser, Delmar, NY (US); Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/686,857

(22) Filed: Apr. 15, 2015

(51) Int. Cl.
*H01L 21/336* (2006.01)
*H01L 21/02* (2006.01)
*H01L 29/66* (2006.01)
*H01L 21/324* (2006.01)
*H01L 29/167* (2006.01)
*H01L 21/311* (2006.01)
*H01L 21/8234* (2006.01)
*H01L 21/225* (2006.01)

(52) U.S. Cl.
CPC .... *H01L 21/02532* (2013.01); *H01L 21/02579* (2013.01); *H01L 21/02694* (2013.01); *H01L 21/2251* (2013.01); *H01L 21/2257* (2013.01); *H01L 21/311* (2013.01); *H01L 21/324* (2013.01); *H01L 21/823418* (2013.01); *H01L 21/823431* (2013.01); *H01L 29/167* (2013.01); *H01L 29/66553* (2013.01); *H01L 29/66636* (2013.01); *H01L 29/66795* (2013.01)

(58) Field of Classification Search
CPC .................................................. H01L 29/66803
See application file for complete search history.

(56) References Cited

U.S. PATENT DOCUMENTS

| | | | |
|---|---|---|---|
| 5,936,278 A | 8/1999 | Hu et al. | |
| 7,429,775 B1 * | 9/2008 | Nayak | H01L 21/823807 257/288 |
| 8,569,846 B2 * | 10/2013 | Lin | H01L 29/665 257/288 |
| 8,679,910 B2 * | 3/2014 | Ming | H01L 21/823807 438/224 |
| 2008/0119031 A1 * | 5/2008 | Pal | H01L 29/7848 438/483 |
| 2010/0012988 A1 * | 1/2010 | Yang | H01L 21/26506 257/288 |
| 2011/0193178 A1 | 8/2011 | Chang et al. | |
| 2012/0074464 A1 | 3/2012 | Cea et al. | |
| 2012/0319203 A1 | 12/2012 | Cheng et al. | |
| 2013/0026539 A1 * | 1/2013 | Tang | H01L 29/66803 257/192 |
| 2014/0217519 A1 * | 8/2014 | Qin | H01L 29/7833 257/408 |

OTHER PUBLICATIONS

Di-lice Action from related application U.S. Appl. No. 14/686,926 dated Jan. 14, 2016.

* cited by examiner

*Primary Examiner* — Stephen W Smoot
(74) *Attorney, Agent, or Firm* — Amerson Law Firm, PLLC (57) ABSTRACT

The present disclosure is directed to forming relatively abrupt junctions between the channel region and source/drain regions of a PMOS transistor device with a germanium-containing channel region. A liner layer is formed in previously formed source/drain cavities prior to the formation of epi semiconductor material in the source/drain cavities above the liner layer. The materials for the liner layer and, particularly, the concentration of germanium (if any is present) are adjusted relative to the germanium concentration in the channel region and the epi source/drain material such that, during an anneal process, dopant materials (e.g., boron) that diffuse from the source/drain region during the anneal process tend to accumulate in or near the liner layer.

18 Claims, 9 Drawing Sheets

METHODS OF FORMING SOURCE/DRAIN REGIONS FOR A PMOS TRANSISTOR DEVICE WITH A GERMANIUM-CONTAINING CHANNEL REGION

BACKGROUND OF THE INVENTION

1. Field of the Invention

Generally, the present disclosure relates to the manufacture of FET semiconductor devices, and, more specifically, to various methods of forming source/drain regions for a PMOS transistor device having a channel region comprised of a germanium-containing material (e.g., SiGe or Ge).

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

Figure 1:
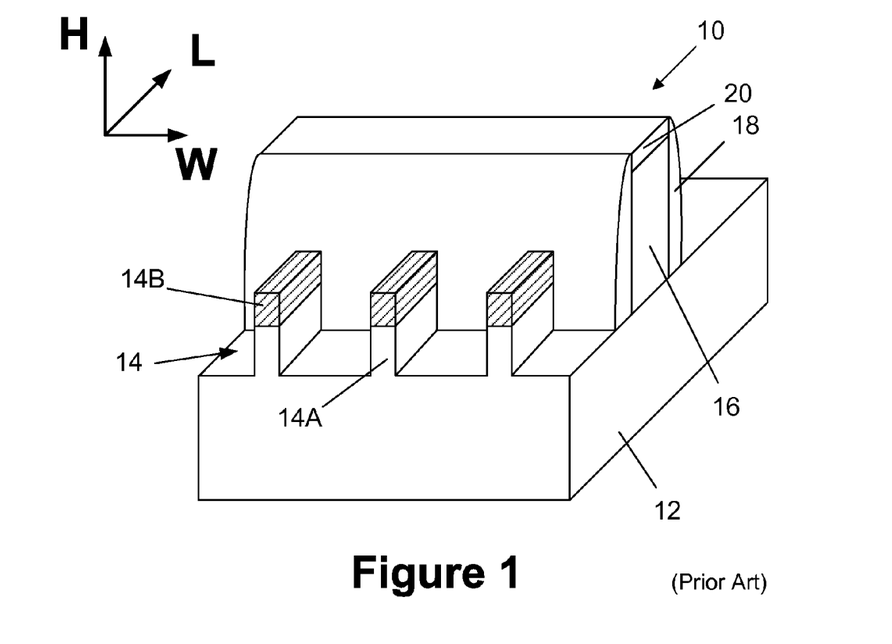
FIG. 1 depicts an illustrative example of a FinFET device with various features identified for reference purposes.

As noted above, transistors come in a variety of configurations. A conventional FET is a planar device, wherein the transistor is formed in and above an active region having a substantially planar upper surface. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers (not separately shown) that serve as the gate electrode for the device 10. In this example, the fins 14 are comprised of a substrate fin portion 14A and an alternative fin material portion 14B. The substrate fin portion 14A may be made of silicon, i.e., the same material as the substrate, and the alternative fin material portion 14B may be made of a material other than the substrate material, for example, silicon-germanium. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. As noted above, device designers are currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed.

However, FinFET devices still exhibit some performance-limiting characteristics. More specifically, as the gate length of such devices continues to shrink, it is very difficult to maintain control of very short channel devices, e.g., devices having a channel length of less than 14 nm, for example, because of dopant diffusion from the source/drain regions of the device (i.e., the portions of the fins positioned laterally outside of the spacers 18) into the channel region of the device 10, i.e., under the gate structure 16 of the device 10. What is needed for advanced devices is a method of forming FinFET devices with alternative channel materials where there is an abrupt junction between the source/drain regions and the channel region of the device 10.

The present disclosure is directed to various methods and devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming source/drain regions for PMOS transistor devices, such as FinFET or planar devices, that have a channel region made of a germanium-containing material (e.g., SiGe or Ge). One illustrative method disclosed herein includes, among other things, forming a layer of silicon-germanium channel material above a surface of a semiconductor substrate, forming a gate structure and sidewall spacers above the layer of silicon-germanium channel material and forming a plurality of source/drain trenches that extend through the layer of silicon-germanium channel material and into the substrate so as to thereby define a plurality of source/drain cavities. The method also includes forming a liner layer on exposed portions of the layer of silicon-germanium channel material and the substrate in the source/drain cavities, wherein the liner layer is comprised of a germanium-containing material having a first germanium concentration, forming a dopant-containing epi semiconductor material on the liner layer so as to at least substantially fill the source/drain cavities, wherein the dopant-containing epi semiconductor material has a second germanium concentration, with the first germanium concentration being at least 15% greater than the second germanium concentration, and performing a thermal anneal process to cause dopant material from the dopant-containing epi semiconductor material to diffuse into the liner layer such that, after the anneal process is completed, diffused dopants are present in the annealed liner.

Another illustrative embodiment disclosed herein includes, among other things, forming a layer of silicon-germanium channel material above a surface of a semiconductor substrate, wherein the layer of silicon-germanium channel material has a first germanium concentration, forming a gate structure and sidewall spacers above the layer of silicon-germanium channel material and forming a plurality of source/drain trenches that extend through the layer of silicon-germanium channel material and into the substrate so as to thereby define a plurality of source/drain cavities. In this example, the method also includes forming a liner layer on exposed portions of the layer of silicon-germanium channel material and the substrate in the source/drain cavities, wherein the liner layer has a thickness that falls within the range of about 1-5 nm and a second germanium concentration, forming a dopant-containing epi silicon-germanium semiconductor material on the liner layer so as to at least substantially fill the source/drain cavities, wherein the dopant-containing epi silicon-germanium semiconductor material has a third germanium concentration that is greater than the first germanium concentration, and wherein the second germanium concentration is at least 15% greater than the third germanium concentration, and performing a thermal anneal process at a temperature that falls within the range of 400-1200° C. to cause dopant material from the dopant-containing epi silicon-germanium semiconductor material to diffuse into the liner layer such that, after the anneal process is completed, the annealed liner layer contains at least about 80% of the diffused dopants from the dopant-containing epi silicon-germanium semiconductor material.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming source/drain regions for PMOS transistor devices having a channel region made of a germanium-containing material (e.g., SiGe or Ge). In general, the methods disclosed herein may be employed in manufacturing either an N-type device or a P-type device, with appropriate processing adjustments as discussed more fully below. Moreover, the gate structure of such devices may be formed using either so-called "gate-first" or "replacement gate" ("gate-last") techniques. As will be readily apparent to those skilled in the art upon a complete reading of the present application, the methods disclosed herein may be employed to form a variety of devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, various doped regions, e.g., source/drain regions, halo implant regions, well regions and the like for the devices, are not depicted in the attached drawings. Of course, the inventions disclosed herein should not be considered to be limited to the illustrative examples depicted and described herein. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail. The various inventions disclosed herein may be employed in the context of forming a variety of different types of transistor devices, e.g., either planar or FinFET devices. For purposes of disclosure, the inventions will be disclosed in the context of forming an illustrative FinFET device. However, the presently disclosed inventions should not be considered to be limited to such an illustrative situation. For example, when it is stated herein that a trench or recess is to be formed in a fin for a FinFET device, the trench or recess could equally be formed in the substrate for a planar FET device.

Figure 2A:
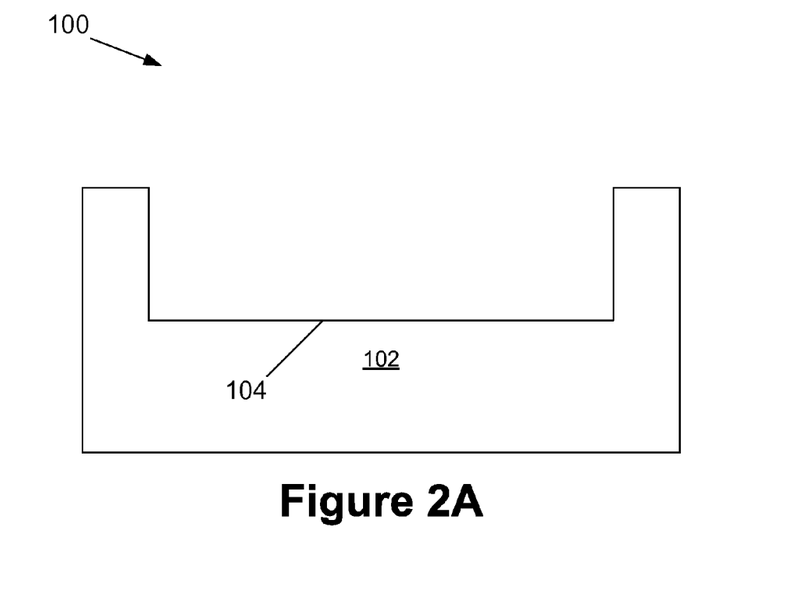
FIGS. 2A-2H depict one illustrative method disclosed herein for forming source/drain regions for a transistor semiconductor device having a channel region made of a germanium-containing material.

FIGS. 2A-2H depict one illustrative method disclosed herein for forming source/drain regions for a transistor device 100 having a channel region made of a germanium-containing material. As shown in FIG. 2A, the device 100 is depicted after an etching process, e.g., an anisotropic etching process, was performed on a substrate 102 through a patterned mask layer (not shown) to define a substrate trench 104 in the substrate 102. The width and depth of the substrate trench 104 may vary depending upon the particular application. For example, the width of the substrate trench 104 may vary depending upon the number of fins to be formed from the material to be subsequently deposited in the substrate trench 104, as described more fully below. The illustrative substrate 102 may be a bulk semiconductor substrate, or it may be the active layer of a so-called SOI (silicon-on-insulator) substrate or a so-called SGOI (silicon/germanium on insulator) substrate. Thus, the terms "substrate," "semiconductor substrate" or "semiconducting substrate" should be understood to cover all semiconductor materials and all forms of such semiconductor materials. The device 100 may be either a P-type FinFET device or an N-type FinFET device. The devices 100 in the attached drawings will be depicted as only having a single fin. Of course, using the methods disclosed herein, a FinFET device may be formed with any desired number of fins.

Figure 2B:
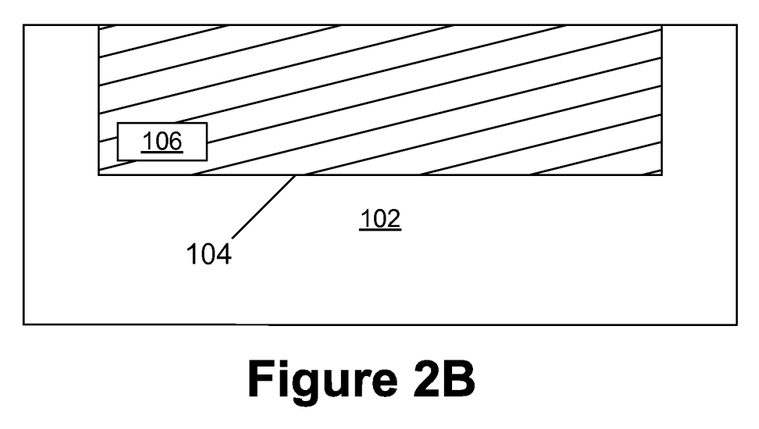

FIG. 2B depicts the device 100 at a point in fabrication after the patterned masking layer used to define the substrate trench 104 was removed, and after a layer of germanium-containing channel semiconductor material 106 was formed in the substrate trench 104. A chemical mechanical polishing (CMP) process was performed at this point in the process flow to planarize the upper surface of the layer of germanium-containing material 106 with the upper surface of the substrate 102. In one illustrative example, the layer of germanium-containing channel material 106 may be a layer of substantially pure germanium or a layer of silicon-germanium ($Si_xGe_{1-x}$, where X may range from 0 to 0.82), i.e., the germanium-containing channel material 106 has a germanium concentration of at least about 18%. In one particular embodiment, the layer of germanium-containing channel material 106 may be a layer of $Si_{0.75}Ge_{0.25}$. The layer of germanium-containing channel material 106 may be formed by performing known epitaxial deposition processes, and it may be formed to any desired thickness, e.g., 40-50 nm. The layer of germanium-containing channel material 106 may also be formed in a strained or unstrained condition. In one embodiment, the layer of germanium-containing channel material 106 is formed such that it covers an area of the substrate wherein multiple FinFET devices with SiGe materials may be formed. The region may be surrounded by isolation regions (not shown) and/or additional isolation regions (not shown) that may be formed within the area occupied by the layer of germanium-containing channel material 106 using traditional manufacturing techniques that are employed when forming FinFET devices.

Figure 2C:
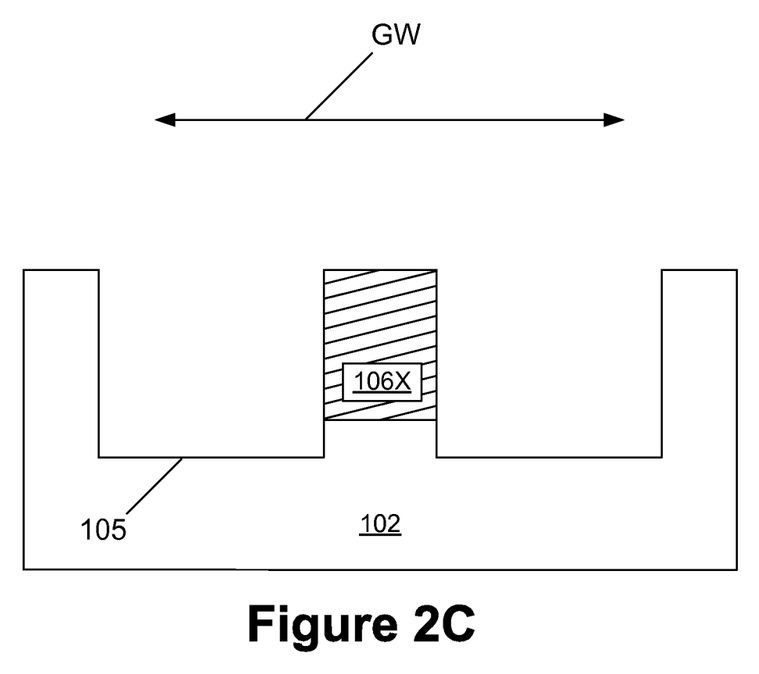

FIG. 2C is cross-sectional view that is taken in a direction that is parallel to what will become the gate width (GW) direction of the completed device 100. FIG. 2C depicts the device 100 after one or more first etching processes, e.g., anisotropic etching processes, were performed on the layer of germanium-containing channel material 106 and the substrate 102 through a patterned mask layer (not shown) to define a plurality of fin-formation trenches 105 that extend through the layer of germanium-containing channel material 106 and into the substrate 102. The formation of the fin-formation trenches 105 defines a fin structure 106X from the layer of germanium-containing channel material 106. Only a single fin 106X is depicted for purposes of disclosing the present inventions. The width and height of the fin structure 106X as well as the depth of the fin-formation trenches 105 may vary depending upon the particular application. In one illustrative example, the depth of the fin-formation trenches 105 may be about 50-100 nm.

Figure 2D:
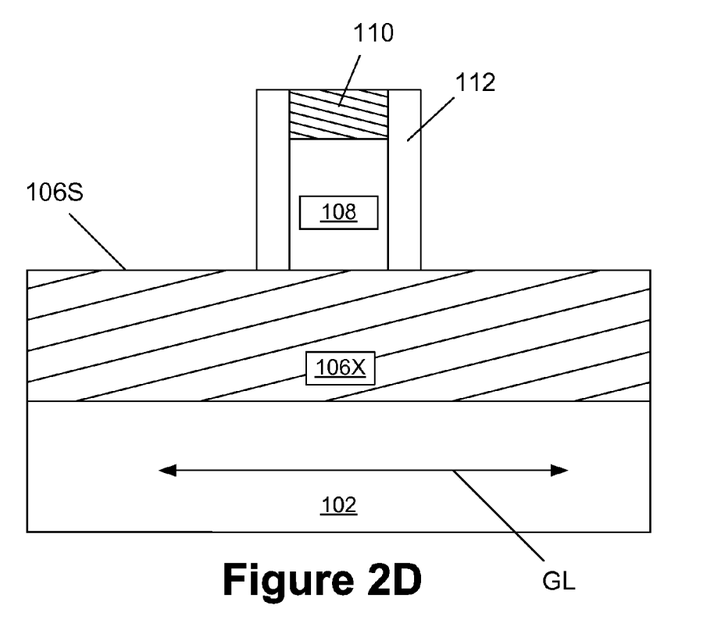

FIG. 2D is cross-sectional view taken through the long-axis of the fin 106X in a direction that is parallel to what will become the gate length (GL) direction of the completed device 100. The fin 106X has an upper surface 106S. In the embodiments disclosed herein, the gate structure for the FinFET device may be formed using either so-called "gate-first" or "replacement gate" manufacturing techniques, both of which are well known to those skilled in the art. Accordingly, FIG. 2D depicts the device 100 after an illustrative gate structure 108, a gate cap layer 110 and simplistically depicted sidewall spacers 112 were formed around the fin 106X. The gate structure 108 depicted herein is intended to be representative in nature of any type of gate structure that may be employed in manufacturing integrated circuit products. The gate structure 108 is typically comprised of a gate insulating layer (not separately shown) and a gate electrode (not separately shown). In a typical gate-first manufacturing process, the gate insulation layer may be comprised of silicon dioxide, while the gate electrode is comprised of a layer of polysilicon. In a typical replacement-gate manufacturing technique, the gate insulation layer may be made of a high-k material (k value of 10 or greater) while the gate electrode may be comprised of one or more layers of metal. The gate cap layer 110 and the sidewall spacers 112 may be made of a material such as silicon nitride, etc.

Figure 2E:
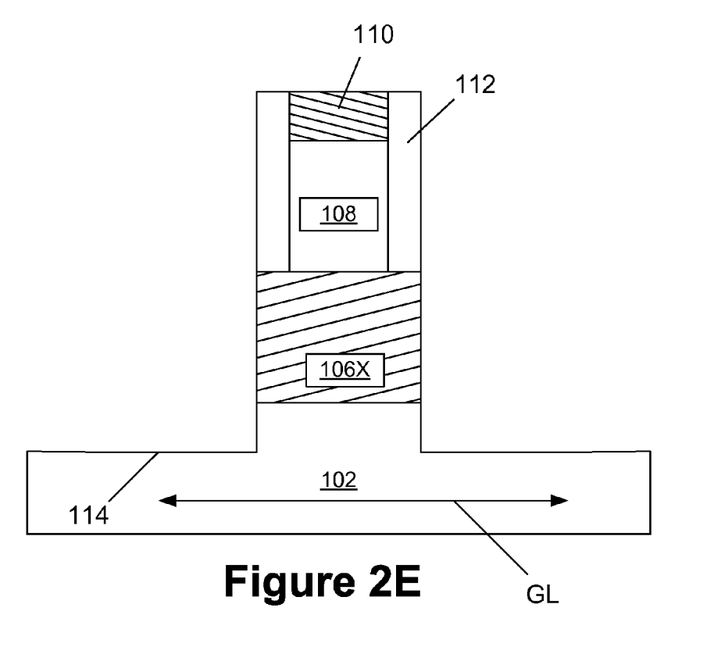

FIG. 2E depicts the device 100 after one or more second etching processes, e.g., anisotropic etching processes, were performed on the device 100 to define a plurality of source/drain trenches 114 that extend through the fin 106X and into the substrate 102, wherein the trenches 114 are substantially self-aligned relative to the sidewall spacers 112. The depth of the source/drain trenches 114 may vary depending upon the particular application. Note that, in a real-world product, other gate structures (not shown) may be formed above the fin 106X. In that situation, the source/drain trenches 114 would be self-aligned between the spacers 112 on two adjacent gate structures. In other cases, shallow trench isolation structures (not shown) may enclose the device 100, in which case a portion of the trenches 114 would extend to the isolation regions. Also note that the cross-sectional configuration of the source/drain trenches 114 may vary depending upon the particular application. In the examples depicted herein, the source/drain trenches 114 have a generally rectangular configuration. In other applications, the source/drain trenches 114 may have a substantially "U"-shaped cross-sectional configuration or they may have a so-called "sigma-shaped" cross-sectional configuration that is typically achieved by performing an etching process that etches at different rates along different crystallographic planes of the materials 106X and/or 102.

Figure 2F:
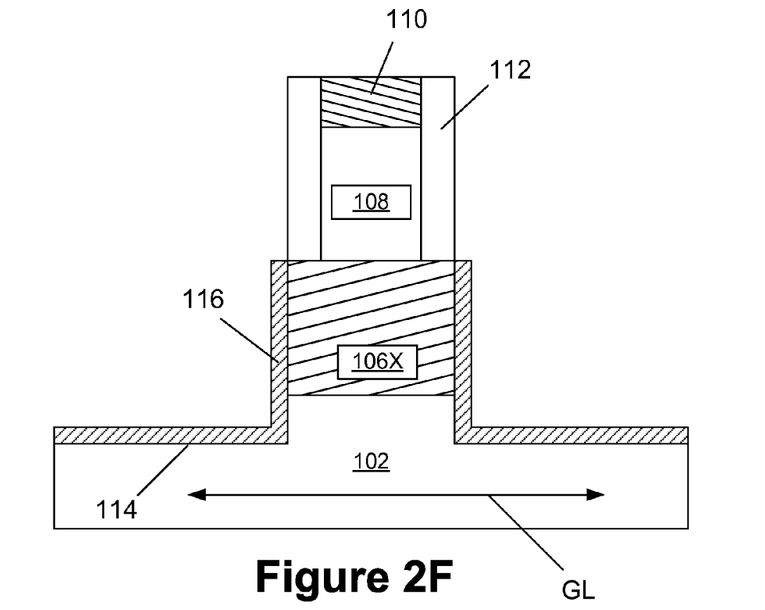

FIG. 2F depicts the device 100 at a point in fabrication wherein a substantially undoped or completely undoped semiconductor material liner layer 116 is formed in the source/drain trenches 114 on the exposed portions of the substrate 102 and the fin 106X. The liner layer 116 may be formed by performing known epitaxial deposition processes, and it may be formed to any desired thickness, e.g., 1-5 nm. Depending upon the particular application, the liner layer 116 may be a layer of substantially pure silicon (i.e., substantially no germanium), a layer of substantially pure germanium, or a layer of silicon-germanium ($Si_xGe_{1-x}$) wherein the germanium concentration of the SiGe material may vary depending upon the particular application and the type of device under construction. The liner layer 116 may also be formed in a strained or unstrained condition.

For example, in the case of an N-type device, it is desirable to impart a tensile stress on the channel region of the device. Accordingly, for an NMOS device, the concentration of germanium in the liner layer 116 should be less than the germanium concentration in the germanium-containing channel material 106. In one particular example, the germanium concentration in the liner layer 116 for an NMOS device should be at least 15% less than the germanium concentration in the germanium-containing channel material 106. In one even more particular example where the NMOS device includes the germanium-containing channel material 106 with a first concentration of germanium and the source/drain region of the device comprises a germanium-containing epi material, e.g., SiGe, (discussed more fully below) with a second concentration of germanium that is less than the first concentration of germanium in the channel material 106, the germanium concentration in the liner layer 116 should be at least 15% less than the first and second concentrations of the channel material 106 and the SiGe source/drain regions, respectively. In one particular example, for an NMOS device, the liner layer 116 may be a layer of substantially pure silicon.

Conversely, for a P-type device it is desirable to impart a compressive stress on the channel region of the device. Accordingly, for a PMOS device, the concentration of germanium in the liner layer 116 should be greater than the germanium concentration in either the germanium-containing channel material 106 or, if present, the germanium-containing epi material of the source/drain regions of the device. In one particular example where the PMOS device includes the germanium-containing channel material 106 with a first concentration of germanium and the source/drain region of the device comprises a germanium-containing epi material, e.g., SiGe, with a second concentration of germanium that is greater than the first concentration of germanium in the channel material 106, the germanium concentration in the liner layer 116 should be at least 15% greater than the second concentration of the SiGe source/drain regions. In one particular example, for a PMOS device, the liner layer 116 may be a layer of substantially pure germanium (i.e., substantially no silicon) or a layer of silicon-germanium ($Si_xGe_{1-x}$) having a germanium concentration that is at least 15% greater than the germanium concentration in the germanium-containing epi material in the source/drain regions.

Figure 2G:
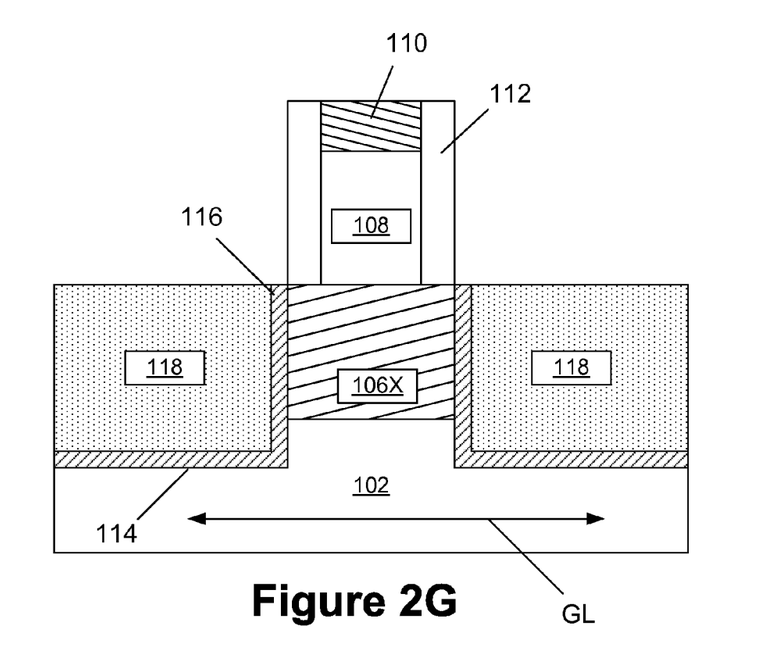

FIG. 2G depicts the device 100 after source/drain epi semiconductor material 118 was formed on the liner layer 116 in the source/drain trenches 114 by performing an epi growth process. In the depicted example, the epi material 118 is formed until such time that it substantially fills the source/drain trenches 114, or it may over-fill the source/drain trenches 114, i.e., to form raised/source drain regions. Depending upon the type of device under construction (e.g., N-type or P-type), the epi material 118 may or may not contain germanium. For example, in the case of an N-type device, the epi material 118 may be silicon, silicon-carbon or silicon-germanium (depending upon the percentage of germanium in the channel), while for a P-type device, the epi material 118 may be a germanium-containing material such as silicon-germanium ($Si_xGe_{1-x}$, where X may range from 0 to 0.65, again depending upon the percentage of germanium in the channel region).

As is normal, dopants will be introduced into the source/drain regions. The dopants used in the source/drain region may vary depending upon the type of device under construction. In one example, where the device 100 is a PMOS device, the source/drain regions may be doped with boron. In the case where the device is an NMOS device, the source/drain regions may be doped with arsenic or phosphorous. The dopant material may be introduced into the epi material 118 in situ (as the material is being formed) or it may be introduced by way of performing one or more ion implantation processes after the epi material 118 is formed. The dopant concentration may vary depending upon the particular application.

Figure 2H:
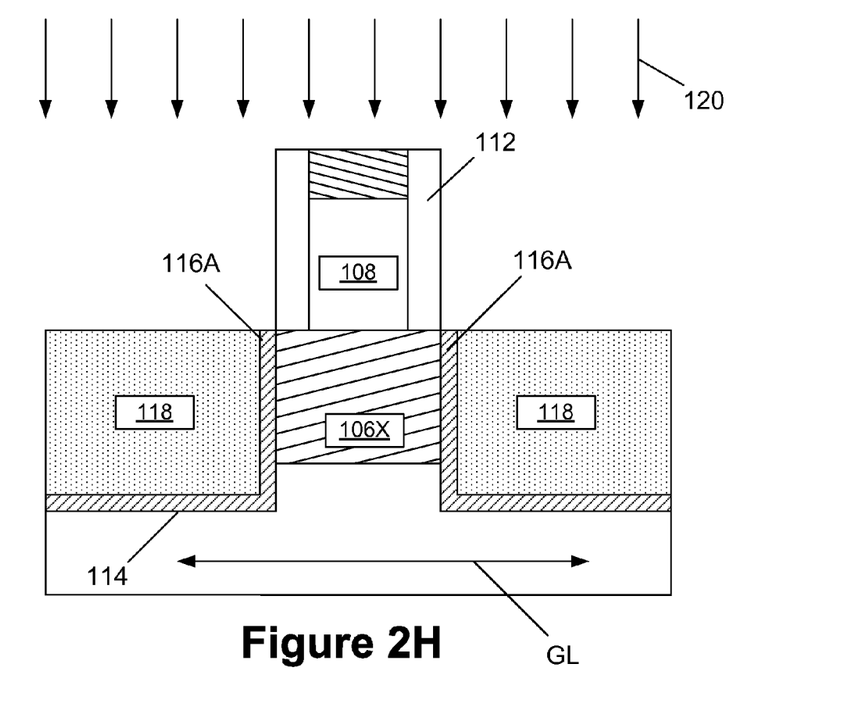

FIG. 2H depicts the device 100 after a thermal anneal process 120 was performed on the device 100. In general, the thermal anneal process 120 is performed under conditions such that dopant (e.g., B for a PMOS device; As or P for an NMOS device) from the epi material 118 diffuses into the liner layer 116 to thereby form a final, annealed dopant-containing liner layer 116A. In general, the purpose for forming the initial liner layer 116 is to trap most of the dopant material that diffuses between the epi material 118 and the germanium-containing channel material 106. In some embodiments, depending upon factors such as the duration of the anneal process 120, the temperature of the anneal process 120, the initial concentration of dopants in the epi material 118, etc., up to about 80-90% of the dopant materials that diffuse from the epi material 118 may be trapped in the final, annealed dopant-containing liner layer 116A. Additionally, some amount of germanium (if present) in the doped source/drain regions (which may be absent in the doped source/drain regions for an NMOS device) will diffuse into the dopant-containing liner layer 116A along with the dopant (e.g., phosphorous) during the anneal process 120.

For example, in the case of a PMOS device, the annealed dopant-containing liner layer 116A acts to limit the diffusion of dopant materials from the source/drain regions into the germanium-containing channel region, i.e., the portion of the fin 106X under the gate. In general, boron, a common source/drain dopant material for PMOS devices, will diffuse faster in silicon that it will in silicon-germanium. Thus, in the case where the dopant in the source/drain region is boron (i.e., a PMOS device), the liner layer 116 is a germanium-containing material (SiGe) with a germanium concentration at least 15% greater than the germanium concentration present in epi material in the source/drain regions 118, the dopant material diffusing from the source/drain region will tend to accumulate or "pile up" in the liner layer 116 during the anneal process 120 since the liner layer 116 has a relatively higher concentration of germanium. This process results in the formation of a relatively abrupt junction at the edge of the channel region having a lateral width that corresponds approximately to the width of the liner layer 116, e.g., about 5 nm/decade, or slightly greater.

For an NMOS device, the germanium concentration will be higher in the channel region than in the source/drain region. Phosphorous, a common source/drain dopant material for NMOS devices, diffuses faster in substantially pure germanium than it does in silicon germanium. Thus, in the case where the dopant in the source/drain region is phosphorous (i.e., an NMOS device), the liner layer 116 may be undoped silicon (or a germanium-containing material having a germanium concentration at least 15% less than the germanium concentration in the channel region) and the channel region is silicon-germanium, the dopant material diffusing from the source/drain region will tend to accumulate or "pile up" in the liner layer 116 during the anneal process 120 since the liner layer 116 has a relatively higher concentration of silicon. This process also results in the formation of a substantially abrupt junction at the edge of the channel region.

The parameters of the thermal anneal process 120 may vary depending upon the particular application. In general, the anneal process should be performed under conditions where dopants from the source/drain region tend to collect in the dopant-containing liner layer 116A after the anneal process 120 is completed. In one illustrative embodiment, the thermal anneal process 120 may be performed at a temperature that falls within the range of about 400-1200° C. for a duration of a few milliseconds to about 1-3 seconds depending upon the annealing conditions and the type of equipment used to perform the anneal process. The thermal anneal process 120 may be performed using, for example, an RTA furnace or by performing a laser anneal process, depending upon the particular application. At this point in the process flow, traditional manufacturing operations may be performed to complete the fabrication of the illustrative FinFET device 100.

Figure 3A:
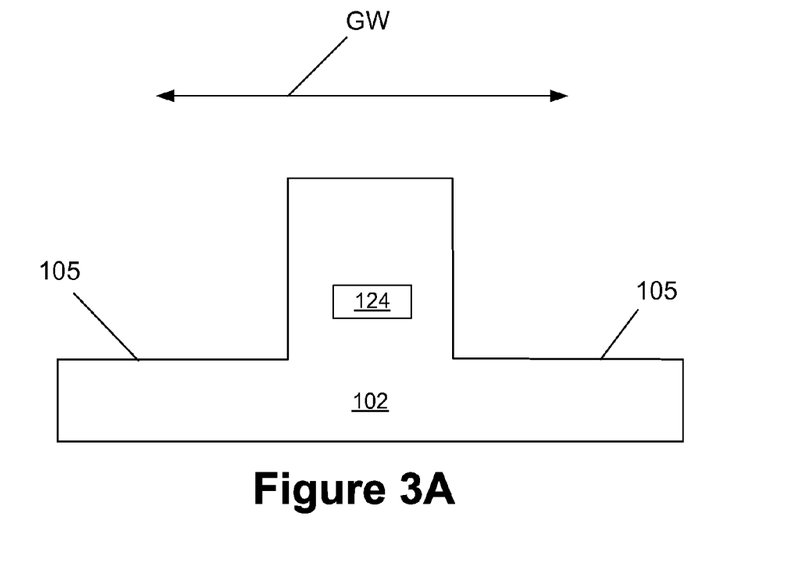
FIGS. 3A-3I depict another illustrative method disclosed herein for forming source/drain regions for a transistor semiconductor device having a channel region made of germanium-containing material (e.g., SiGe or Ge).

FIGS. 3A-3I depict another illustrative method disclosed herein for forming source/drain regions for a transistor device having a channel region comprised of a germanium-containing material. In this embodiment, the SiGe fins 106X are formed above a recessed silicon fin structure. FIG. 3A depicts the device 100 after a plurality of first etching processes, e.g., anisotropic etching processes, were performed on the substrate 102 to define a plurality of the fin-formation trenches 105 in the substrate 102, so as to thereby define a substrate fin 124 comprised of just the substrate material 102. As noted above, the width and height of the fin 124 as well as the depth of the initial trenches 105 may vary depending upon the particular application.

Figure 3B:
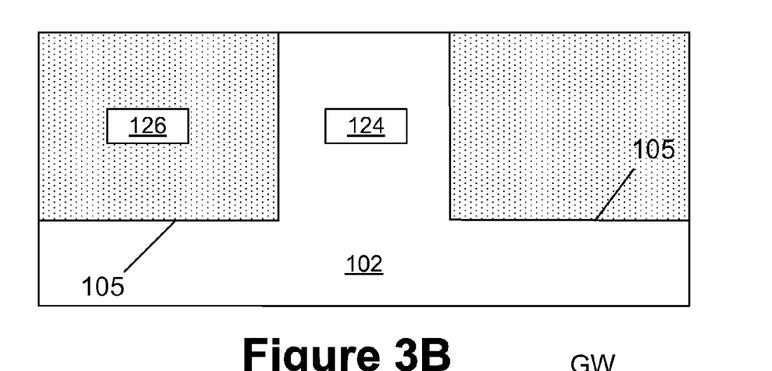

FIG. 3B depicts the device after the trenches 105 were over-filled with an insulating material 126, e.g., silicon dioxide, and after a chemical mechanical polishing (CMP) process was performed on the layer of insulating material 126 to planarize its upper surface with the upper surface of the substrate fin 124.

Figure 3C:
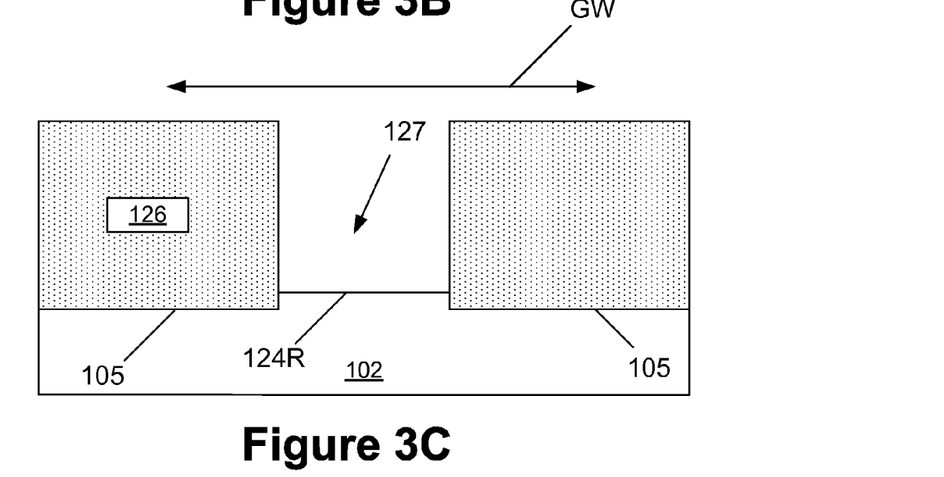

FIG. 3C depicts the device 100 after a recess etching process was performed to remove portions of the substrate fin 124 such that it has a recessed upper surface 124R. This results in the formation of a fin-cavity 127 above the recessed substrate fin. The amount of recessing may vary depending upon the particular application. As indicated, the view in FIG. 3C is a cross-sectional view taken in a direction that is parallel to what will become the gate width (GW) direction of the device 100 when completed.

Figure 3D:
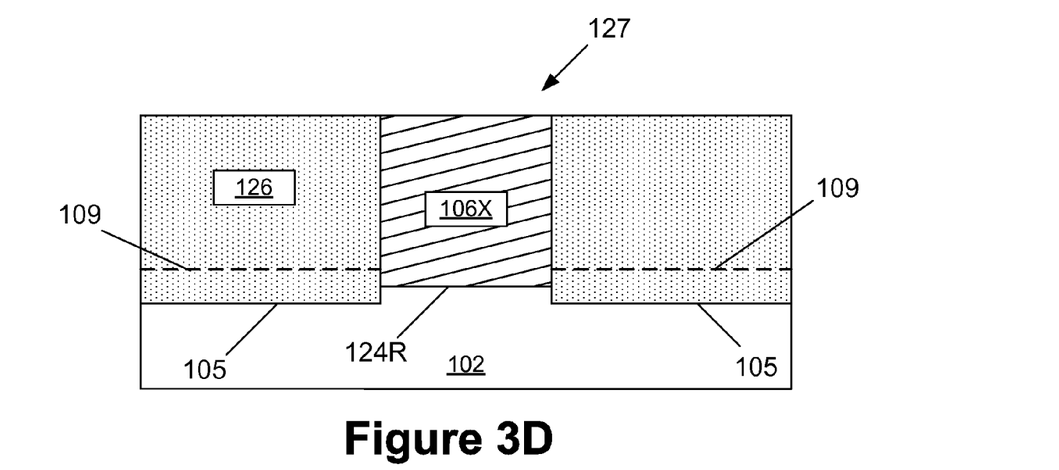

FIG. 3D depicts the device 100 after an epitaxial growth process was performed to form the above-described germanium-containing material 106 in the fin cavity 127 above the recessed surface 124R of the substrate fin, so as to thereby define a germanium-containing fin 106X. The germanium-containing fin 106X may have the same concentration as that described above for the layer of germanium-containing material 106. The fin 106X may also be formed in a strained or unstrained condition. Additionally, after the fin 106X is formed, a recess etching process may be performed to recess the insulating material 126 to the desired height level (as indicated by the dashed-lines 109) within the trenches 105.

Figure 3E:
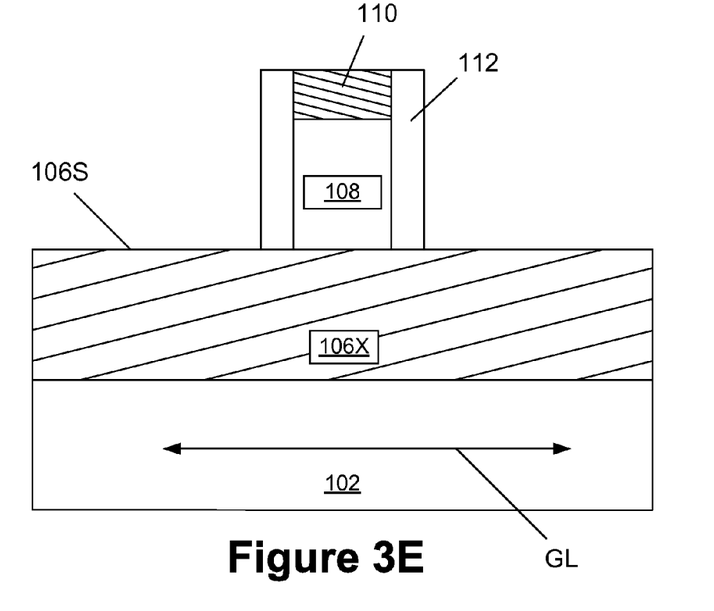

FIG. 3E is cross-sectional view taken through the long-axis of the fin 106X in a direction that is parallel to what will become the gate length (GL) direction of the completed device 100. FIG. 3E depicts the device 100 after the above-described gate structure 108, gate cap layer 110 and sidewall spacers 112 were formed around the fin 106X.

Figure 3F:
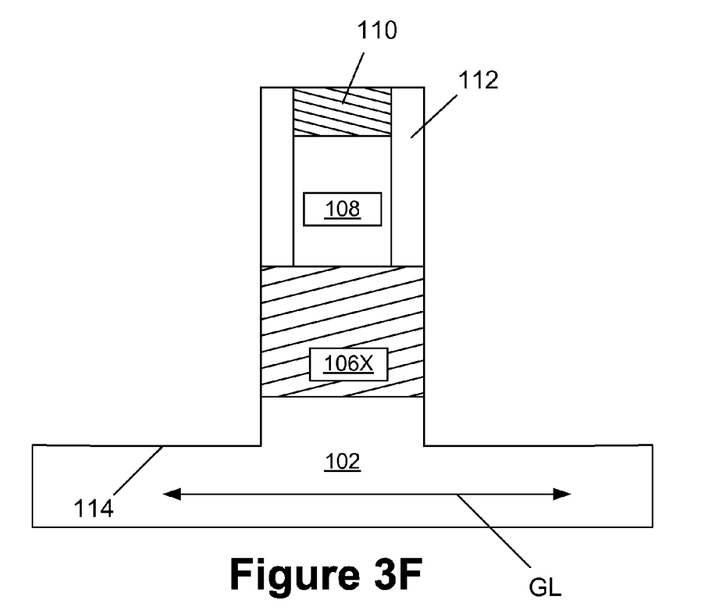

FIG. 3F depicts the device 100 after one or more etching processes, e.g., anisotropic etching processes, were performed on the device 100 to define the above-described source/drain trenches 114 that extend through the fin 106X and into the substrate 102, wherein the trenches 114 are substantially self-aligned relative to the sidewall spacers 112.

Figure 3G:
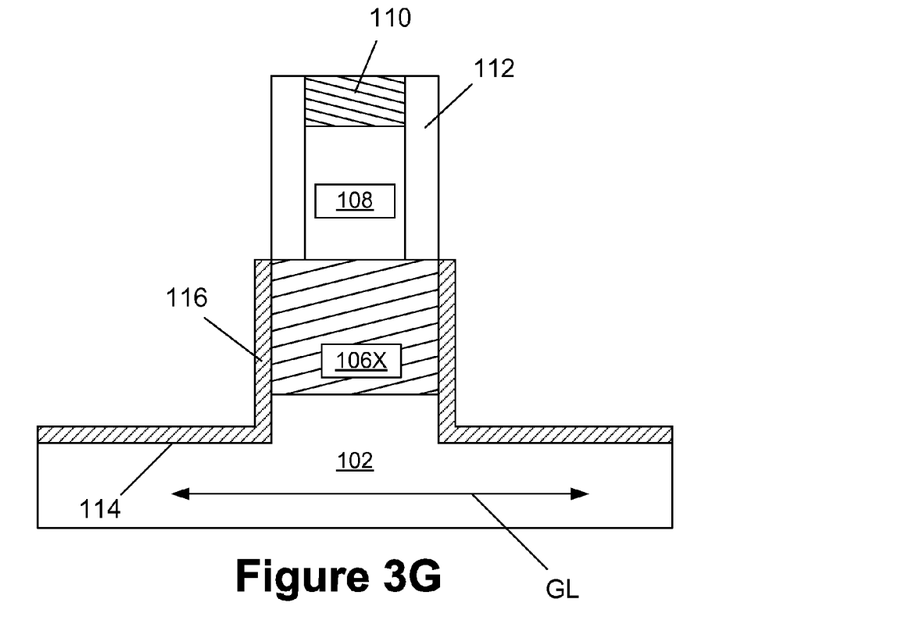

FIG. 3G depicts the device 100 at a point in fabrication after the above-described liner layer 116 was formed in the source/drain trenches 114 on the exposed portions of the substrate 102 and the fin 106X.

Figure 3H:
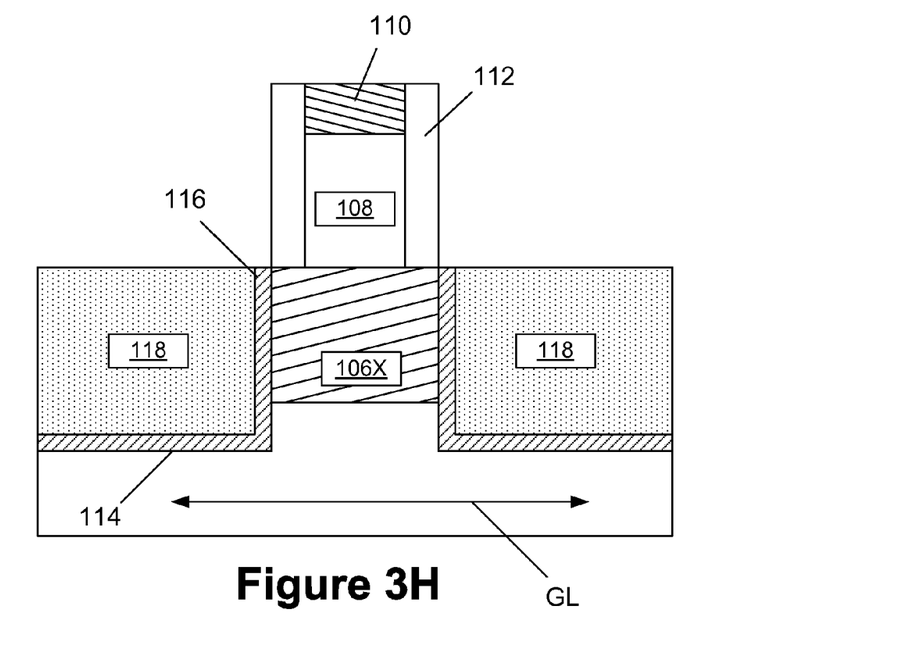

FIG. 3H depicts the device 100 after the above-described source/drain epi semiconductor material 118 was formed on the liner layer 116 in the source/drain trenches 114 by performing an epi growth process.

Figure 3I:
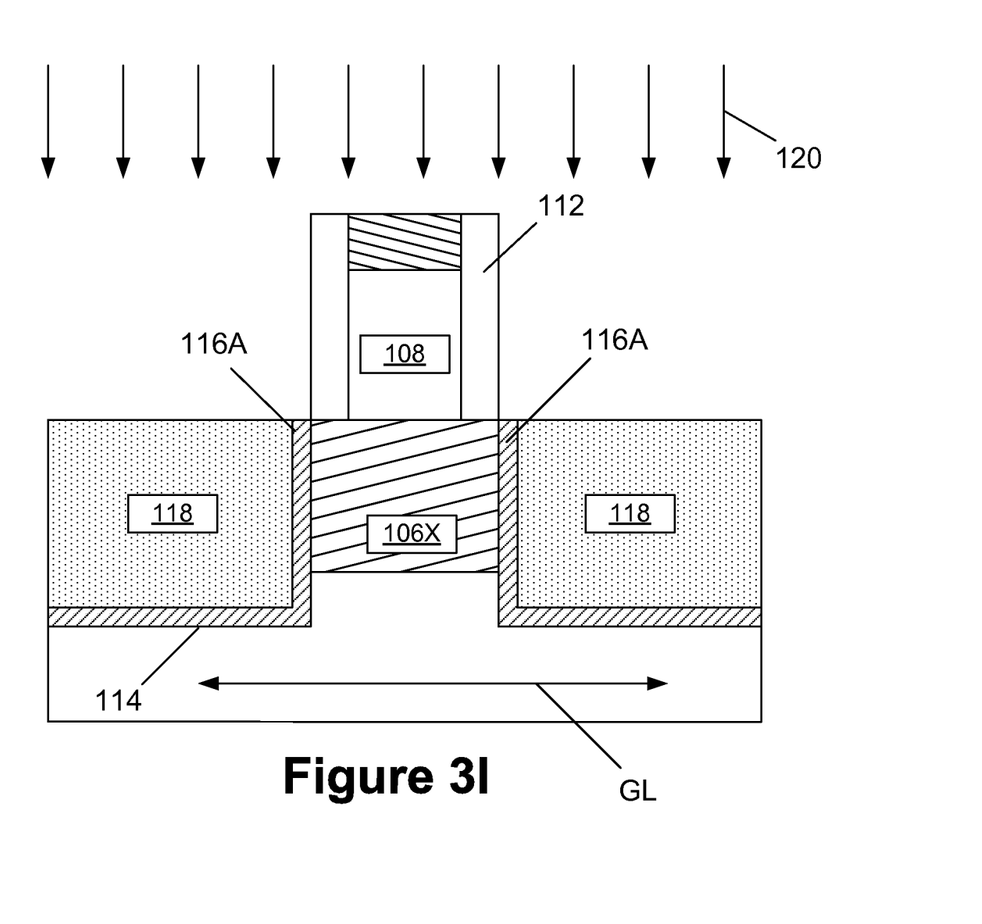

FIG. 3I depicts the device 100 after the above-described thermal anneal process 120 was performed on the device 100. As noted above, depending upon the device under construction, the anneal process causes dopant material from the source/drain regions to accumulate in the dopant-containing liner layer 116A and thereby form the above-described abrupt junction near the channel region of the device 100. At this point in the process flow, traditional manufacturing operations may be performed to complete the fabrication of the illustrative FinFET device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a PMOS transistor device, comprising:
    forming a layer of silicon-germanium channel material above a surface of a semiconductor substrate;
    forming a gate structure above said layer of silicon-germanium channel material;
    forming sidewall spacers adjacent said gate structure;
    forming a plurality of source/drain trenches that extend through said layer of silicon-germanium channel material and into said substrate so as to thereby define a plurality of source/drain cavities;
    forming a liner layer on exposed portions of said layer of silicon-germanium channel material and said substrate in said source/drain cavities, said liner layer being comprised of a germanium-containing material having a first germanium concentration;
    forming a dopant-containing epi semiconductor material on said liner layer so as to at least substantially fill said source/drain cavities, said dopant-containing epi semiconductor material having a second germanium concentration, wherein said first germanium concentration is at least 15% greater than said second germanium concentration; and
    performing a thermal anneal process to cause dopant material from said dopant-containing epi semiconductor material to diffuse into said liner layer such that, after said anneal process is completed, diffused dopants are present in the annealed liner layer.

2. The method of claim 1, wherein said PMOS transistor device is one of a FinFET device or a planar transistor device.

3. The method of claim 1, wherein forming said dopant-containing epi semiconductor material comprises performing an epitaxial deposition process and introducing said dopant into said epi semiconductor material as it is being deposited.

4. The method of claim 1, wherein forming said dopant-containing epi semiconductor material comprises performing an epitaxial deposition process to initially form undoped epi semiconductor material in said source/drain cavities and thereafter performing an ion implantation process to introduce said dopant into said undoped epi semiconductor material.

5. The method of claim 1, wherein said liner layer has a thickness that falls within a range of about 1-5 nm.

6. The method of claim 1, wherein said dopant-containing source/drain epi semiconductor material is silicon-germanium material and said dopant comprises boron.

7. The method of claim 1, wherein forming said liner layer comprises performing an epitaxial deposition process.

8. The method of claim 1, wherein performing said thermal anneal process comprises performing said thermal anneal process at a temperature that falls within a range of 400-1200° C.

9. The method of claim 1, wherein forming said layer of silicon-germanium channel material above a surface of said semiconductor substrate comprises:
    forming a trench in said substrate;
    forming said layer of silicon-germanium channel material in said trench in said substrate; and
    performing a planarization process to planarize an upper surface of said layer of silicon-germanium channel material with an upper surface of said substrate.

10. The method of claim 9, wherein said PMOS transistor device is a FinFET device and the method further comprises forming a plurality of fin formation trenches that extend through said layer of silicon-germanium channel material and into said substrate so as to define a fin comprised of a portion of said layer of silicon-germanium channel material.

11. The method of claim 1, wherein said PMOS transistor device is a FinFET device and wherein forming said layer of silicon-germanium channel material above said surface of said semiconductor substrate comprises:
    forming a plurality of fin formation trenches in said substrate to define a substrate fin;
    forming an insulating material in said fin formation trenches adjacent said substrate fin;
    performing a recess etching process to remove a portion of said substrate fin and thereby define a fin cavity above said recessed substrate fin; and
    forming said layer of silicon-germanium channel material in said fin cavity of said recessed substrate fin.

12. The method of claim 1, wherein a germanium concentration of said silicon-germanium channel material is at least 18%.

13. The method of claim 1, wherein said liner layer is formed on and in contact with said layer of silicon-germanium channel material and said substrate, and said dopant-containing source/drain epi semiconductor material is formed on and in contact with said liner layer.

14. The method of claim 1, wherein said annealed liner layer contains at least about 80% of said diffused dopants from said dopant-containing epi semiconductor material.

15. A method of forming a PMOS transistor device, comprising:
    forming a layer of silicon-germanium channel material above a surface of a semiconductor substrate, the layer of silicon-germanium channel material having a first germanium concentration;
    forming a gate structure above said layer of silicon-germanium channel material;
    forming sidewall spacers adjacent said gate structure;
    forming a plurality of source/drain trenches that extend through said layer of silicon-germanium channel material and into said substrate so as to thereby define a plurality of source/drain cavities;
    forming a liner layer on exposed portions of said layer of silicon-germanium channel material and said substrate in said source/drain cavities, said liner layer having a thickness that falls within a range of about 1-5 nm and a second germanium concentration;
    forming a dopant-containing epi silicon-germanium semiconductor material on said liner layer so as to at least substantially fill said source/drain cavities, wherein said dopant-containing epi silicon-germanium semiconductor material has a third germanium concentration that is greater than said first germanium concentration, said second germanium concentration is at least 15% greater than said third germanium concentration; and
    performing a thermal anneal process at a temperature that falls within a range of 400-1200° C. to cause dopant material from said dopant-containing epi silicon-germanium semiconductor material to diffuse into said liner layer such that, after said anneal process is completed, said annealed liner layer contains at least about 80% of said diffused dopants from said dopant-containing epi silicon-germanium semiconductor material.

16. The method of claim 15, wherein said dopant-containing source/drain epi semiconductor material is silicon-germanium material and said dopant comprises boron.

17. The method of claim 15, wherein said liner layer is formed on and in contact with said layer of silicon-germanium channel material and said substrate, and said dopant-containing source/drain epi semiconductor material is formed on and in contact with said liner layer.

18. The method of claim 17, wherein a germanium concentration of said silicon-germanium channel material is at least 18%.

* * * * *